United States Patent [19]

Seino et al.

[11] 4,452,880

[45] Jun. 5, 1984

[54] PROCESS FOR DEVELOPING POSITIVE PHOTOSENSITIVE LITHOGRAPHIC PRINTING PLATE

[75] Inventors: Minoru Seino; Atsuo Yamazaki; Toru Aoki; Akihiko Suzuki, all of Hino, Japan

[73] Assignee: Konishiroku Photo Industry Co., Ltd., Tokyo, Japan

[21] Appl. No.: 385,655

[22] PCT Filed: Sep. 21, 1981

[86] PCT No.: PCT/JP81/00247

§ 371 Date: May 18, 1982

§ 102(e) Date: May 18, 1982

[87] PCT Pub. No.: WO82/01086

PCT Pub. Date: Apr. 1, 1982

[30] Foreign Application Priority Data

Sep. 20, 1980 [JP] Japan .................................. 55-131002

[51] Int. Cl.³ .......................... G03F 7/08; G03C 5/34
[52] U.S. Cl. .................................... 430/309; 430/302; 430/331; 430/165; 430/190
[58] Field of Search ............... 430/309, 331, 175, 165, 430/193, 189, 190

[56] References Cited

U.S. PATENT DOCUMENTS

| | | | |
|---|---|---|---|
| 3,471,289 | 10/1969 | Herrick | 430/309 |
| 3,615,480 | 10/1971 | Lam | 430/331 |
| 3,905,816 | 9/1975 | Boardman et al. | 430/175 |
| 3,907,564 | 9/1975 | Boardman et al. | 430/309 |
| 4,259,434 | 3/1981 | Yamasue et al. | 430/309 |
| 4,282,301 | 8/1981 | Ohta | 430/331 |

FOREIGN PATENT DOCUMENTS 55-115039  9/1980  Japan .

*Primary Examiner*—Mary F. Downey
*Attorney, Agent, or Firm*—Frishauf, Holtz, Goodman & Woodward

[57] ABSTRACT

A developing process suitable to treat a positive photosensitive lithographic printing plate comprising a photosensitive layer containing, as the photosensitive constituent, an o-quinonediazide compound provided on an aluminium plate. A positive photo-sensitive lithographic printing plate is exposed imagewise and then developed with a developing solution containing an aqueous solution of an alkali metal silicate in which the alkali metal is essentially constituted by potassium. With the method, development treatment can be conducted stably for a long period without generating insolubes in the developing solution even when an extremely large quantity of positive photosensitive lithographic plates are treated.

9 Claims, No Drawings

PROCESS FOR DEVELOPING POSITIVE PHOTOSENSITIVE LITHOGRAPHIC PRINTING PLATE

FIELD OF THE INVENTION

This invention relates to a process for developing a positive photosensitive lithographic printing plate (also referred to as positive pre-sensitized plate or abbreviated as positive PS plate), and more particularly to a developing method suitable for treating a positive PS plate comprising a photosensitive layer containing, as the photosensitive constituent, an o-quinonediazide compound provided on an aluminium substrate by use of an automatic developing machine.

DESCRIPTION OF THE PRIOR ART

Conventional positive PS plates which are most widely used comprise a photosensitive layer containing, as the photosensitive constituent, an o-naphthoquinonediazide compound provided on an aluminium substrate. The photosensitive constituent in said photosensitive layer contains a structural unit

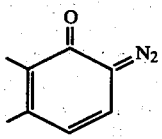

as the photosensitive group. This structural unit is decomposed by an active light ray to form an alkali-soluble group, resulting in an increase in the solubility in an alkali and a difference in the solubility between the exposed area and the unexposed area. In this way, a positive image is obtained by developing the exposed photosensitive layer by use of an aqueous alkali solution.

Recently, an automatic developing machine for a PS plate is widely used for the purpose of rationalizing and standardizing the printing plate making work in the printing industry. In one of the automatic developing machines most widely used for positive PS plates, the developing solution is jeted from a pipe having a plurality of nozzles to the surface of the PS plate, and the used developing solution is recovered through a filter to a tank. In the development of the positive PS plate by use of such an automatic developing machine, an aqueous solution of sodium silicate is generally used as the developing solution. However, this method has disadvantage in that it is impossible to treat many PS plates. To solve this problem, it has been proposed in Japanese Provisional Patent Publication No. 22759/1980 to adopt a replenishing system and use, as the developing solution, an aqueous solution of alkali metal silicates in which the ratio $[SiO_2]/[M]$, (provided that $[SiO_2]$ denotes the content of $SiO_2$ in the unit volume when the amount of $SiO_2$ is expressed in terms of gram molecule unit and $[M]$ denotes the content of alkali metals in the unit volume when the amount of M is expressed in terms of gram atom unit), is within the range between 0.5 and 0.75, the concentration of $SiO_2$ is within the range between 1% and 4% by weight, and at least 20 atomic % of the alkali metal based on gram atom is constituted by potassium. In this developing method, an aqueous solution of alkali metal silicates having a ratio $[SiO_2]/[M]$ within the range of 0.25 to 0.75 is used as the replenishing solution so as to treat many positive PS plates.

However, it has been found that, with the developing method just described above, insolubles are formed in the developing solution when a larger quantity of positive PS plates comprising an aluminium substrate are treated. The insolubles formed stick to the PS plate carrying roller and clog the nozzles and plug the pores in a filter. In addition, the developing solution is exhausted very quickly due to the absorption of carbon dioxide gas from ambient air. With the developing process, therefore, a high accuracy is required with respect to the replenishment.

Therefore, an object of the present invention is to provide a developing process which can achieve development treatment of a large quantity of positive PS plates without changing the developing solution for a long period.

Another object of the present invention is to provide a developing process which can achieve development of a large quantity of positive PS plates by use of a generally used type of automatic developing machine, in which the developing solution is jeted from a spray unit to the surface of the photosensitive layer, without changing the developing solution in the tank for a long period and without causing the spray nozzles to be clogged.

A further object of the present invention is to reduce the frequency of changing the developing solution, thereby to decrease the amount of waste liquid formed.

A still further object of the present invention is to provide a developing process which can achieve long stability of development when a large quantity of positive PS plates are treated for development.

DISCLOSURE OF THE INVENTION

The inventors studied eagerly and have found that the above objects are accomplished by a developing process in which a positive photosensitive lighographic printing plate comprising a photosensitive layer containing, as the photosensitive constituent, an o-quinonediazide compound provided on an aluminium plate is exposed imagewise and thereafter developed with a developing solution containing an aqueous solution of an alkali metal silicate, characterized in that the alkali metal of said alkali metal silicate is essentially constituted by potassium, the molar ratio of $SiO_2/K_2O$ in said developing solution is within the range between 1.60 and 2.00, and said developing solution contains $K_2O$ in a proportion between 1.8% and 7.2% by weight.

The positive PS plate to be treated by the developing process in accordance with the present invention has basically a photosensitive layer containing an o-quinonediazide compound as the photosensitive constituent provided on an aluminium plate as a substrate. Preferred aluminium substrates include a pure aluminium plate, an aluminium alloy plate, and a plastic film on which aluminium is laminated or deposited. It is preferable that the surface of the aluminium substrate is subjected to surface treatment such as graining, dipping in an aqueous solution of sodium silicate, potassium fluorozirconate, a phosphate or the like, or anodic oxidation.

The photosensitive constituent in the photosensitive layer provided on the substrate, which is subjected to the surface treatment and provided with the hydrophilic surface, consists of an o-quinonediazide compound. Particularly preferred o-quinonediazide compounds are the o-naphthoquinonediazide compounds, which are described, for example, in U.S. Pat. Nos. 3,046,110, 3,046,111, 3,046,112, 3,046,115, 3,046,118, 3,046,119, 3,046,120, 3,046,121, 3,046,122, 3,046,123, 3,061,430, 3,102,809, 3,106,465, 3,635,707 and 3,647,443, and many other publications, and these compounds can advantageously be employed. Among these, o-naphthoquinonediazide sulfonates or o-naphthoquinonediazide carboxylates of aromatic hydroxy compounds, and o-naphthoquinonediazidesulfonic acid amides or o-naphthoquinonediazidecarboxylic acid amides of aromatic amino compounds are particularly preferred. These o-quinonediazide compounds may be used alone. However, it is preferred that they are mixed with an alkali-soluble resin and the obtained mixture is applied as the photosensitive layer. Preferred alkali-soluble resins include a novolak type phenolic resins such as phenol formaldehyde resins, o-cresol formaldehyde resins, and m-cresol formaldehyde resins. More preferably, the phenolic resins as described above are used together with a condensate obtained from a phenol or a cresol substituted by an alkyl group having from 3 to 8 carbon atoms and formaldehyde, such as t-butylphenol formaldehyde resin.

The photosensitive layer containing the o-quinonediazide compound as the photosensitive constituent may further contain additives such as dyes, plasticizers and constituents for imparting the print-out performance.

The photosensitive composition containing the o-naphthoquinonediazides as the photosensitive constituent is applied to the substrate in the form of a solution in an appropriate solvent. The appropriate solvents are, for example, glycol ethers such as ethylene glycol monomethyl ether, ethylene glycol monoethyl ether, and 2-methoxyethyl acetate; ketones such as acetone, methyl ethyl ketone, and cyclohexanone; and chlorinated hydrocarbons such as ethylene dichloride.

The photosensitive layer containing the o-quinonediazide compound as the photosensitive constituent is applied to the substrate in an amount of about 0.5 to 7 g/m$^2$, more preferably 1.5 to 3 g/m$^2$.

When the positive PS plate thus obtained is exposed to light rich in active light rays, such as carbon arc lamp, mercury vapor lamp, metal halide lamp, xenon lamp and tungsten lamp, through a transparent original, the exposed area becomes alkali-soluble. Therefore, the exposed area of the photosensitive layer is dissolved out by an aqueous alkali solution, and the hydrophilic surface of the substrate at that area is laid bare.

It has been found that, by using the developing solution and the replenishing solution containing potassium silicate in accordance with the present invention, it is possible to achieve the treatment of positive PS plates corresponding to an area of 30 m$^2$ or more per liter of the original feed amount of the developing solution with one solution change for every several months, unlike the conventional method with which the developing solution must be changed for every several days.

In the present invention, the ratio of [SiO$_2$]/[K$_2$O] in the developing solution should be within the range between 1.60 and 2.00. If the ratio of [SiO$_2$]/[K$_2$O] is below 1.60, insolubles are generated when a very large quantity of positive PS plates (corresponding to an area of 30 m$^2$ or more per liter of original feed amount of the developing solution) are treated. The insolubles thus generated clog the nozzles of the developing solution spray unit and the filter, through which the used developing solution is recovered, of the automatic developing machine, thereby making it impossible to continue the development operation. If the ratio of [SiO$_2$]/[K$_2$O] is below 1.60 and the [K$_2$] content is below 1.8% by weight, the developing solution fluctuates greatly due to the absorption of carbon dioxide gas from ambient air, necessitating high accuracy replenishment to the developing solution. In contrast, if the ratio of [SiO$_2$]/[K$_2$O] is above 2.00 and the [K$_2$O] content is above 7.20% by weight, the dry solids of the developing solution sticking to the nozzles of the developing solution spray unit cannot easily be dissolved again when the treatment is conducted by intermittently operating the automatic developing machine, thereby causing the spray unit to be clogged and making it impossible to restart the operation.

As a preferred embodiment of the present invention, there may be mentioned a process wherein the above-mentioned aqueous solution of potassium silicate is used as the developing solution, and a solution having a composition capable of satisfying the requirements of the present invention is used as the replenishing solution for development.

The replenishing solution is added to compensate for the constituent (mainly the alkali constituent) consumed when the positive PS plates are treated, the portion of the developing solution taken out from the system together with the developed PS plates, and the lakali constituent neutralized by carbon dioxide gas contained in ambient air. Accordingly, any aqueous solution of potassium silicate may be used as the replenishing solution if it can maintain the above-described requirement range of the present invention when added to the developing solution as the positive PS plates are treated or as the composition of the developing solution changes with time. In the embodiment of the present invention, the replenishing solution preferably has a ratio of [SiO$_2$]/[K$_2$O] within the range between 0.4 and 2.0.

The developing solution and the replenishing solution for development which are used in accordance with the present invention may further contain an organic solvent, a surface active agent, an anti-foaming agent and/or the like.

Changes in the development capability of the developing solution can be known by developing the PS plates exposed through a step tablet and measuring the changes of the number of the step having the lowest density and not dissolved by the developing solution, the changes in the pH value of the developing solution, or the like. Further, if the amount of the replenishing solution necessary to restore the condition of the fresh developing solution is measured in advance, it is possible to easily known the frequency of adding the replenishing solution and the addition amount thereof which are required for the actual treatment.

According to the developing process of this invention, in cases where an extremely number (corresponding to an area of 30 m$^2$ or more per liter of the original feed amount of the developing solution) of positive PS plates in which aluminium is used as a substrate are treated, it is possible to conduct the development treatment in a manner stable for a long period without generating any insolubles in the developing solution.

The most preferred embodiments of the invention.

The present invention will hereinafter be described in more detail by the following examples. However, these examples should not be construed to limit the scope of this invention:

EXAMPLE 1

A photosensitive solution was prepared by dissolving one part by weight of a naphthoquinone-1,2-diazide-5-sulfonate of a novolak type phenol formaldehyde resin and 1.5 parts by weight of a cresol-phenol novolak resin in 30 parts by weight of methyl cellosolve. A grained aluminium plate having a thickness of 0.3 mm was anodized in sulfuric acid to form an oxidized film having a thickness corresponding to about 2.5 g/m², followed by full washing and drying. On the oxide film thus formed, the photosensitive solution prepared as described above was applied and dried to obtain a photosensitive plate having a photosensitive layer of a thickness corresponding to about 2.8 g/m². The positive PS plate thus obtained was cut to obtain a plurality of plates having a size of 1310×1050 mm, which were then exposed for 60 seconds to a 2 kW metal halide lamp at a distance of 80 cm through a transparent positive.

On the other hand, 21 liters of a developing solution having a ratio of $[SiO_2]/[K_2O]$ of 1.78 and a $[K_2O]$ content of 3.90 were prepared by using an aqueous potassium silicate solution ($SiO_2$ content: 26% by weight, $K_2O$ content: 13% by weight), an aqueous potassium hydroxide solution (48 wt.% aqueous solution) and pure water. The developing solution thus prepared was then fed to the developing solution tank of an automatic developing machine for PS plates (PSA-1315R available from Konishiroku Photo Industry Co., Ltd. in Japan). A replenishing solution having a ratio of $[SiO_2]/[K_2O]$ of 0.88 and a $[K_2O]$ content of 7.79 was prepared from the above-mentioned raw materials, and 30 ml of this replenishing solution was added to the developing solution each time one PS plate exposed as described above was treated in the automatic developing machine. In this way, 30 plates were treated over three hours and, then, the treatment was halted for two hours. When the aforesaid positive PS plates exposed through a step tablet (21 steps with the difference in optical density of one step being 0.15) were treated before and after the halting of the treatment to check the sensitivity, a change of the number of the step having the lowest density and not dissolved by the developing solution was scarcely observed. After halting the treatment, 30 plates are again treated. Thereafter, the automatic developing machine containing the solution was allowed to stand for 16 hours, and then 280 ml of the above-mentioned replenishing solution was added and the treatment was finished. After the above-described procedure was repeated and 1680 plates in total were treated, no precipitate was observed in the developing solution, and the nozzles of the automatic developing machine were not clogged. When the aforesaid PS plates exposed through a step tablet described above were treated each time before allowing the machine to stand for 16 hours to check the sensitivity, the difference between the number of the step having the lowest density and not dissolved by the developing solution and the number when the first PS plate was treated was within ½ step in each cases.

Further, when the drop in the sensitivity was checked by prolonging the time of allowing the machine to stand midway during the above-described treatment, the number of the step having the lowest density and not dissolved by the developing solution dropped about one step when this time was 50 hours. The number returned to the original level when 875 ml of the aforesaid replenishing solution was added.

On the other hand, 21 liters of developing solution having a ratio of $[SiO_2]/[K_2O]$ of 1.20 and a $[K_2O]$ content of 3.90% by weight were prepared by using the same raw materials as described above, and fed to the aforesaid automatic developing machine. The treatment was conducted in the such way as described above by adding 34 ml of a replenishing solution having a ratio of $[SiO_2]/[K_2O]$ of 0.60 and a $[K_2O]$ content of 7.79% by weight each time one PS plate described above was treated. After allowing the machine to stand for 16 hours, 900 ml of the replenishing solution was added. After 600 plates were treated, insolubles were generated in the developing solution. When the machine was then allowed to stand for 16 hours and then restarted, the nozzles were clogged, affecting the treatment work.

Further, a developing solution and a replenishing solution were prepared by replacing one half (in terms of gram atom) of potassium in the developing solution and the replenishing solution, which were used for comparison as described above, by sodium. When 550 plates were treated with these solutions in the same way as described above, insolubles were generated in the developing solution and the nozzles were clogged, affecting the treatment work.

On the other hand, a developing solution having a ratio of $[SiO_2]/[K_2O]$ of 1.16 and a $[K_2O]$ content of 1.52% by weight was prepared, and 21 liters of this solution was fed to the automatic developing machine described above. When the machine was allowed to stand and the drop in the sensitivity was checked, the sensitivity changed by one step after 10 hours. In addition, there was a large influence of carbon dioxide gas contained in ambient air, and thus it was necessary to control the replenishment in high accuracy.

EXAMPLE 2

Forty-nine liters of a developing solution having a ratio of $[SiO_2]/[K_2O]$ of 1.98 and a $[K_2O]$ content of 7.2% by weight were prepared and fed to the aforesaid developing machine. Then, 42 ml of a replenishing solution having a ratio of $[SiO_2]/[K_2O]$ of 1.44 and a $[K_2O]$ content of 9.84% by weight were added each time one PS plate described above is treated. In this way, 100 plates were treated over 8 hours, and the solution was allowed to stand for 16 hours. Then, 320 ml of the aforesaid replenishing solution was added and the treatment was finished. When this procedure was repeated to treat 3,000 plates, no insolubles were generated in the developing solution.

On the other hand, 49 liters of a developing solution having a ratio of $[SiO_2]/[K_2O]$ of 2.22 and a $[K_2O]$ content of 7.8% by weight were prepared and fed to the aforesaid automatic developing machine. Then, PS plates were treated in the same way as described above by using a replenishing solution having a $[SiO_2]/[K_2O]$ of 1.66 and a $[K_2O]$ content of 10.44. When the treatment was restarted after treating 700 plates and allowing the solution to stand for 16 hours, the dry solids of the developing solution could not be redissolved easily and the nozzles were clogged, affecting the treatment work.

EXAMPLE 3

A photosensitive solution was prepared by dissolving one part by weight of a naphthoquinone-1,2-diazide-5-sulfonate of a novolak type phenolic resin and 2.5 parts by weight of a cresol-phenol novolak resin in 45 parts by weight of methyl cellosolve. The photosensitive solution thus prepared was applied to the aluminium plate used in Example 1 and dried. In this way, a photosensitive plate having a photosensitive layer having a thickness corresponding to about 2.5 g/m² was obtained. The photosensitive plate thus obtained was then cut to a size of 1310 x 1050 mm and exposed in the same way as described above.

On the other hand, 49 liters of a developing solution having a ratio of [SiO₂]/[K₂O] of 1.6 and a [K₂O] content of 1.8% by weight were fed to the aforesaid automatic developing machine. Then, 43 ml of a replenishing solution having a ratio of [SiO₂]/[K₂O] of 0.58 and a [K₂O] content of 4.96% by weight was added each time one PS plate described above was treated. After 2,500 plates were treated in this way, no insolubles were generated in the developing solution. The treatment could be conducted satisfactorily, and prints of satisfactory quality were obtained. Further, the sensitivity was stable within a half step in terms of the number of the step having the lowest density and not dissolved by the developing solution.

We claim:

1. A process for developing a positive photosensitive lithographic printing plate comprising imagewise exposing a positive lithographic printing plate comprising a photosensitive layer containing, as a photosensitive constituent, an o-quinonediazide compound provided on an aluminum plate; and developing said imagewise exposed photosensitive lithographic printing plate with a developing solution containing an aqueous solution of an alkali metal silicate, characterized in that the alkali metal of said alkali metal silicate consists of potassium, the molar ratio of SiO₂/K₂O in said developing solution being within the range between 1.60 and 2.00, said developing solution containing K₂O in an amount between 1.8% and 7.2% by weight.

2. The process of claim 1 wherein the aluminum plate is selected from the group consisting of a pure aluminum plate, an aluminum alloy plate, a plastic film having a layer of aluminum thereon.

3. The process of claim 2 wherein said aluminum plate is surface treated.

4. The process of claim 1 wherein said o-quinonediazide compound is an o-naphthoquinonediazide compound.

5. The process of claim 4 wherein said o-napthoquinonediazide compound is selected from o-naphthoquinonediazide sulfonates, o-naphthoquinonediazide carboxylates of an aromatic hydroxy compound, o-naphthoquinonediazide carboxylic acid amides and o-naphthoquinonediazide sulfonic acid amides of an aromatic amino compound.

6. The process of claim 1 wherein said photosensitive layer is present in an amount of about 0.5 to 7 g/m².

7. The process of claim 1 wherein said developing solution further contains at least one compound selected from the group consisting of an organic solvent, a surface active agent and an anti-foaming agent.

8. The process of claim 4 wherein said photosensitive layer further contains an alkali soluble resin.

9. The process of claim 8 wherein said alkali soluble resin is a novolak type phenolic resin.

* * * * *